United States Patent
Paran et al.

(10) Patent No.: US 9,697,940 B2
(45) Date of Patent: Jul. 4, 2017

(54) APPARATUS AND METHODS FOR GENERATING A UNIFORM MAGNETIC FIELD

(71) Applicant: ANALOG DEVICES GLOBAL, Hamilton (BM)

(72) Inventors: Alexander Perez Paran, Quezon (PH); Brigido Prudente Sarino, Jr., Cavite (PH); Darwin Punla Tolentino, Cavite (PH)

(73) Assignee: Analog Devices Global, Hamilton (BM)

( * ) Notice: Subject to any disclaimer, the term of this patent is extended or adjusted under 35 U.S.C. 154(b) by 217 days.

(21) Appl. No.: 14/464,067

(22) Filed: Aug. 20, 2014

(65) Prior Publication Data

US 2016/0055950 A1    Feb. 25, 2016

(51) Int. Cl.
*G01R 33/09* (2006.01)
*H01F 7/02* (2006.01)
(Continued)

(52) U.S. Cl.
CPC .............. *H01F 7/0284* (2013.01); *G01D 5/12* (2013.01); *G01D 5/145* (2013.01); *G01R 33/091* (2013.01); *G01R 33/093* (2013.01)

(58) Field of Classification Search
CPC ....... H01F 7/02; H01F 7/0284; H02K 49/102; G11B 2005/0016; G01R 33/09;
(Continued)

(56) References Cited

U.S. PATENT DOCUMENTS

| 4,115,716 A | 9/1978 | Ogasawala et al. |
| 6,806,702 B2 | 10/2004 | Lamb et al. |

(Continued)

FOREIGN PATENT DOCUMENTS

| CN | 102032862 A | 4/2011 |
| CN | 102235850 A | 11/2011 |

OTHER PUBLICATIONS

Extended European Search Report dated Jan. 4, 2016 for corresponding European Application No. 15180445.7.
(Continued)

*Primary Examiner* — Son Le
(74) *Attorney, Agent, or Firm* — Knobbe, Martens, Olson & Bear LLP

(57) ABSTRACT

Apparatus and methods for generating a uniform magnetic field are provided herein. In certain configurations, a magnetic structure includes one or more pairs of magnets positioned within a housing. The magnets of each pair are arranged in parallel and include poles that are reversed in polarity relative to one another. For example, in certain implementations, a first pair of magnets includes a first magnet and a second magnet arranged side by side, with a north pole of the first magnet adjacent a south pole of the second magnet and with a south pole of the first magnet adjacent a north pole of the second magnet. The housing is implemented using a magnetic redirecting material, which can confine magnetic flux and reduce stray magnetic fields. The magnetic structure can be used to generate a magnetic field that is substantially uniform in a region of interest.

24 Claims, 11 Drawing Sheets

(51) Int. Cl.
*G01D 5/14* (2006.01)
*G01D 5/12* (2006.01)

(58) Field of Classification Search
CPC ...... G01R 33/093; G01R 33/091; G01D 5/12; G01D 5/145; G04C 5/00
See application file for complete search history.

(56) References Cited

U.S. PATENT DOCUMENTS

| | | | |
|---|---|---|---|
| 7,151,369 B1 | 12/2006 | Wolf | |
| 7,417,421 B2 | 8/2008 | Wendt | |
| 2004/0164729 A1* | 8/2004 | Ikeda | G01D 5/145 324/207.21 |
| 2008/0164866 A1* | 7/2008 | Steinich | G01D 11/245 324/207.2 |
| 2009/0295375 A1 | 12/2009 | Oohira | |
| 2011/0080162 A1* | 4/2011 | Steinich | G01B 7/30 324/207.25 |
| 2011/0248705 A1 | 10/2011 | Matsumoto et al. | |
| 2014/0159710 A1* | 6/2014 | Yu | G01P 13/04 324/207.25 |

OTHER PUBLICATIONS

Infineon, "Sense & Control: Designing a Disc Magnet for use with Infineon GMR Sensors," Oct. 15, 2011; 19 pp., V1.0; Infineon Technologies AG, Munich, Germany.
Office Action Issued in Chinese Patent Application No. 201510509718.8, dated Dec. 22, 2016 in 10 pages.
EP 15180445.7, Notice of allowance, Mar. 24, 2017.

* cited by examiner

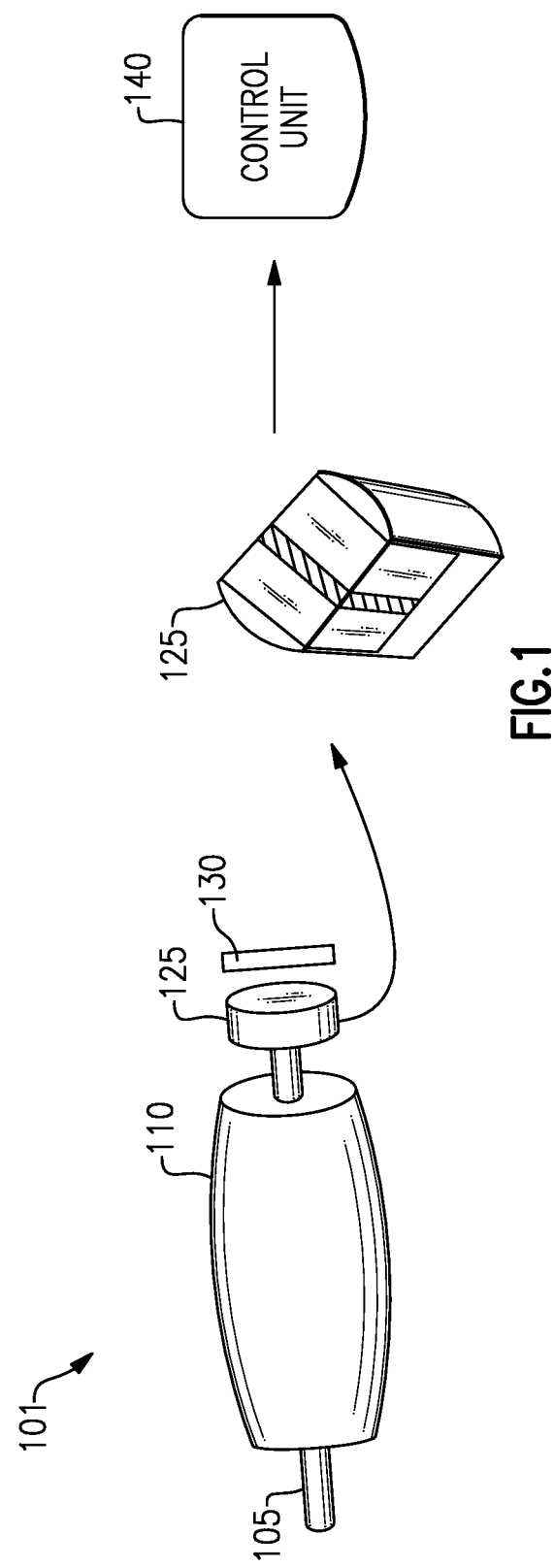

APPARATUS AND METHODS FOR GENERATING A UNIFORM MAGNETIC FIELD

BACKGROUND

Field

The present invention is generally related to methods and systems for generating magnetic fields, and more particularly, to methods and systems related to generating a uniform magnetic field suitable for stimulating magnetoresistive (MR) devices.

Background

Magnetic field direction sensors can be used to measure orientation of a magnetic field generating object, such as a permanent magnet, with respect to a sensing axis of a magnetic field direction sensor. Thus, when the magnet is carried on a rotating object, such as a shaft whose rotation is to be encoded, the angular displacement of the object can be determined in a non-contacting manner.

One difficulty with certain magnetic field direction sensors is that such sensors can operate in part by stimulating the sensor using a uniform magnetic field. For example, an anisotropic magnetoresistive (AMR) sensor can include magnetoresistive elements, which have a resistance that changes based on the angle of an incident magnetic field. When the magnetic field lines are not sufficiently parallel and/or the magnetic field strength is not sufficiently uniform, errors are introduced into the output of such sensors. Furthermore, stray magnetic fields can degrade sensor performance.

Therefore, a need exists for improved magnetic structures suitable for generating a uniform magnetic field.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an apparatus comprising a rotatable housing. The rotatable housing comprising a first wall comprising a first magnetic redirecting material and a second wall opposite the first wall, the second wall comprising the first magnetic redirecting material. The apparatus further comprising at least two magnets positioned within the rotatable housing between the first and second walls. The at least two magnets comprise a first pair of magnets magnetized parallel and opposite to one another. The rotatable housing alters a magnetic field of the at least two magnets relative to a configuration including the at least two magnets without the rotatable housing.

Another aspect of the disclosure provides a method for generating a uniform magnetic field. The method includes providing a rotatable housing comprising a first wall and a second wall opposite the first wall, the first wall and second wall each comprising a first magnetic redirecting material. The method further includes positioning at least two magnets within the rotatable housing between the first and second walls, wherein the at least two magnets comprise a first pair of magnets that are magnetized parallel and opposite to one another. The method further includes generating a uniform magnetic field in a region of interest using the at least two magnets and the housing, wherein the housing alters a magnetic field of the at least two magnets relative to a configuration including the at least two magnets without the housing.

Another aspect of the disclosure provides an angular position sensing apparatus. The apparatus comprising a rotatable housing. The rotatable housing comprising a first wall comprising a first magnetic redirecting material and a second wall opposite the first wall, the second wall comprising the first magnetic redirecting material. The apparatus further comprising at least two magnets positioned within the rotatable housing between the first and second walls. The at least two magnets comprise a first pair of magnets magnetized parallel and opposite to one another. The at least two magnets and the rotatable housing generate a uniform magnetic field in a region of interest. The apparatus further comprises a sensor positioned in the uniform magnetic field.

BRIEF DESCRIPTION OF THE DRAWINGS

Embodiments will now be discussed by way of example only, with reference to the accompanying drawings, in which:

FIG. 1 is a diagram of an example anisotropic magnetoresistive (AMR) sensor system.

DETAILED DESCRIPTION

Figure 2A:
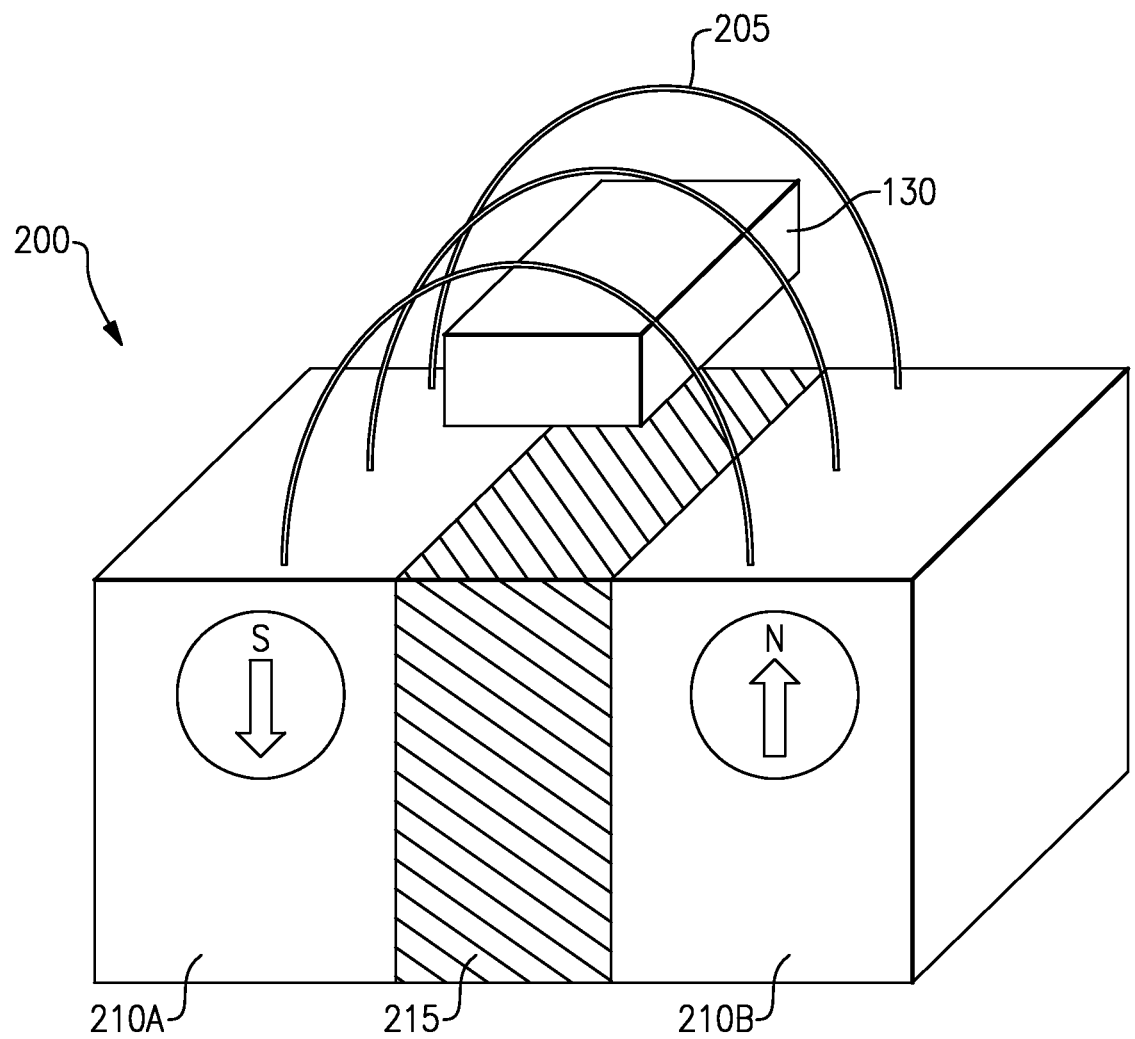
FIG. 2A is a perspective view of an example magnetic structure configuration producing a uniform magnetic field in a predefined area.

Various aspects of the novel systems, apparatuses, and methods are described more fully hereinafter with reference to the accompanying drawings. The teachings disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of or combined with any other aspect of the invention. For example, an apparatus may be implemented or a method may be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein may be embodied by one or more elements of a claim.

A magnetoresistive (MR) device, such as an anisotropic magnetoresistive (AMR) sensor, can be used to sense a magnetic field of an object to determine the object's orientation. To properly stimulate an MR device, the MR device should be exposed to a uniform magnetic field having a precise orientation. When the field lines are not sufficiently parallel, errors can be introduced at the output of the MR device. Furthermore, stray magnetic fields can impact the MR device's performance.

Magnetic field lines can be difficult to control. For example, it can be difficult to focus and concentrate magnetic field lines in a specific region of interest while providing a relatively small magnetic field outside the region. Furthermore, within the region of interest, the magnetic field should have sufficient uniformity, stability, and parallelism.

Apparatus and methods for generating a uniform magnetic field are provided herein. In certain configurations, a magnetic structure includes one or more pairs of magnets positioned within a housing. The magnets of each pair are arranged in parallel and include poles that are reversed in polarity relative to one another. For example, in certain implementations, a first pair of magnets includes a first magnet and a second magnet arranged side by side, with a north pole of the first magnet adjacent a south pole of the second magnet and with a south pole of the first magnet adjacent a north pole of the second magnet. The housing is implemented using a magnetic redirecting material, which can confine magnetic flux and reduce stray magnetic fields. The magnetic structure can be used to generate a magnetic field that is substantially uniform in a region of interest, and which provides a relatively small amount of stray magnetic flux outside the region.

Accordingly, the magnetic structures provided herein can be used to generate uniform magnetic fields in a localized region. In certain implementations, the magnetic structures are adapted to receive one or more inserts that can be used to shape or influence the magnetic field's characteristics in the region of interest. By configuring the magnetic structure to generate a magnetic field that can be controlled via inserts, the magnetic structure can generate a magnetic field that is tailored for a specific application or purpose.

As described above, the magnetic structure's housing is implemented using a magnetic redirecting material, such as steel, and/or iron. In some embodiments, the magnetic redirecting material may comprise any material having a permeability greater than 9.42e-4 H/m (SI unit), corresponding to a relative permeability of 750. As persons having ordinary skill in the art will appreciate, a magnetic redirecting material can draw-in magnetic flux, and thus can be suitable for pulling in stray magnetic fields. The magnetic redirecting material may draw-in magnetic flux by providing the magnetic field lines a better path of travel (analogous to the path of least resistance in an electric circuit). Implementing the magnetic structure's housing using a magnetic redirecting material can also aid in eliminating or reducing magnetic crosstalk with external magnets.

The magnetic structures described herein can provide a uniform magnetic field over a relatively large area, and thus can provide low angular error when used as a stimulus to an AMR sensor. The magnetic structures can also exhibit high temperature stability, and thus can provide robust performance in a wide range of applications and operating environments. Moreover, the magnetic structures described herein can be scalable, and can have a relatively small and compact design relative to certain conventional magnetic structures, such as those using active coils.

The magnetic structures can be suitable for a wide variety of applications, including, for example, in automotive and/or industrial applications. In one example, a magnetic structure can be used to stimulate an AMR sensor with a uniform magnetic field. In such configurations, stimulating the AMR sensor with the magnetic structure can provide superior performance, such as higher sensor accuracy and/or greater immunity to errors associated with geometric inaccuracies.

FIG. 1 is a diagram of an example anisotropic magnetoresistive (AMR) sensor system 101. The AMR sensor system 101 comprises a rotatable shaft 105, a motor 110, a magnetic structure 125, a sensor 130, and a control unit 140. In the AMR sensor system 101, the motor 110 may drive the rotatable shaft 105 and the magnetic structure 125.

The sensor 130 can include magnetoresistive elements which have a resistance that changes based on an angle of magnetic field generated by the magnetic structure 125. Additionally, a current and/or voltage of the magnetoresistive elements can be observed to determine an angular position and/or speed of the rotating shaft 105. The sensor 130 may then send its observation results to the control unit 140. In some embodiments, the control unit 140 may comprise an integrated circuit (IC), such as a signal processor disposed on a circuit board. In order for the sensor 130 to accurately observe the shaft's rotation, it is desirable to place the sensor 130 in a homogeneous or uniform magnetic field created by the magnetic structure 125.

Certain implementations herein relate to magnetic structures, such as the magnetic structure 125, suitable for generating a homogeneous magnetic field.

Although FIG. 1 illustrates a magnetic structure in the context of an automotive application, the magnetic structures herein can be used in a wide variety of other applications, including, for example, industrial applications.

FIG. 2A is a perspective view of an example magnetic structure configuration producing a uniform magnetic field in a predefined area or region of interest. In FIG. 2A, a magnetic structure 200 comprises a first magnet 210A, a second magnet 210B, and an insert 215. For purposes of figure clarity, the magnetic structure's housing is not illustrated in FIG. 2A.

The first magnet 210A and the second magnet 210B are positioned parallel to one another, such that the first magnet 210A and the second magnet 210B are arranged side-by-side. Additionally, the first magnet 210A and the second magnet 210B include poles with reversed or alternating polarity so as to facilitate a uniform magnetic field. As shown, the first magnet 210A comprises a south-north polarity orientation and the second magnet 210B comprises a north-south polarity orientation. Thus, a north pole of the first magnet 210A is adjacent a south pole of the second magnet 210B, and a south pole of the first magnet 210A is adjacent a north pole of the second magnet 210B.

The insert 215 keeps the two magnets 210A and 210B apart, if required. The insert 215 may be comprised of any suitable material, magnetic or nonmagnetic (such as steel, iron, copper, aluminum, or plastic), so chosen to enhance the creation of a uniform magnetic field in the predefined area. These enhancements include preventing stray fields from entering the area or modifying the shape of the field lines in the predefined area.

In some embodiments, the predetermined area may comprise an area located vertically above the magnetic structure 200 such that there is an air gap between the predetermined area and the magnetic structure 200. In certain configurations, the area is located in a radially centered position above the magnetic structure 200 configuration when viewed from above. Configuring the magnetic structure to generate a uniform magnetic field that is radially centered can enhance sensor accuracy in configurations in which the magnetic structure 200 is rotated about an axis.

As shown in FIG. 2A, the predetermined area may comprise an area the in which the sensor 130 is placed. For example, in the illustrated configuration, the magnetic field lines 205 cross over the sensor 130 in a substantially uniform and parallel plane.

Figure 2B:
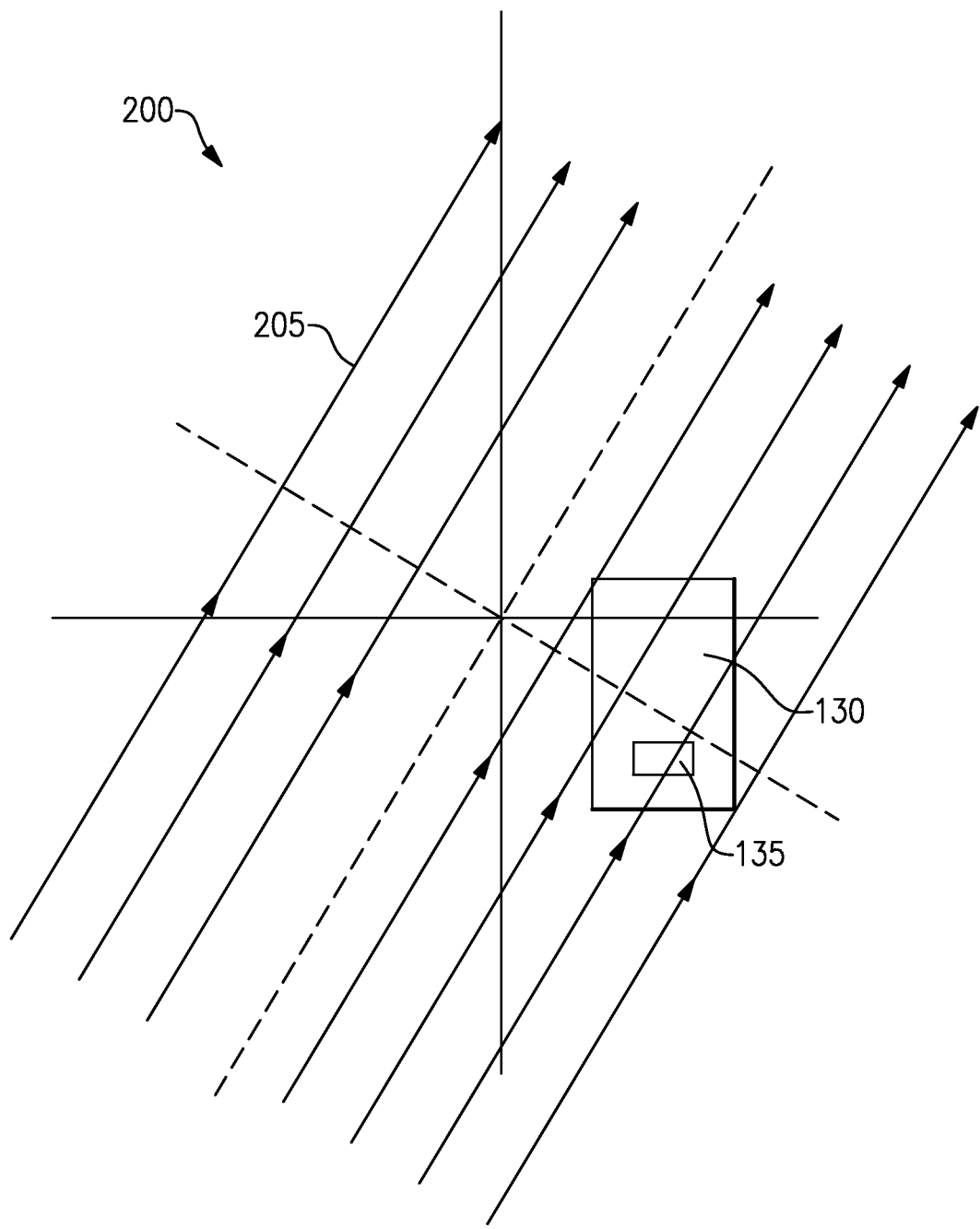
FIG. 2B is a top view of a sensor in the uniform magnetic field produced by the example magnetic structure of FIG. 2A.

FIG. 2B is a top view of the sensor 130 in the uniform magnetic field produced by the example magnetic structure 200 of FIG. 2A. In FIG. 2B, the magnetic field lines 205 are parallel and uniform across the plane and the sensor 130 comprises magnetoresistive circuitry 135 for measuring angular position, such as the angular position of the shaft 105 of FIG. 1.

Embodiments described herein relate to magnetic structure configurations configured to produce a uniform magnetic field in a predetermined area. FIGS. 3-14 illustrate example magnetic structure configurations. Elements common to certain FIGs. share common reference indicia, and only differences between the magnetic structure configurations are described herein for the sake of brevity.

Figure 3:
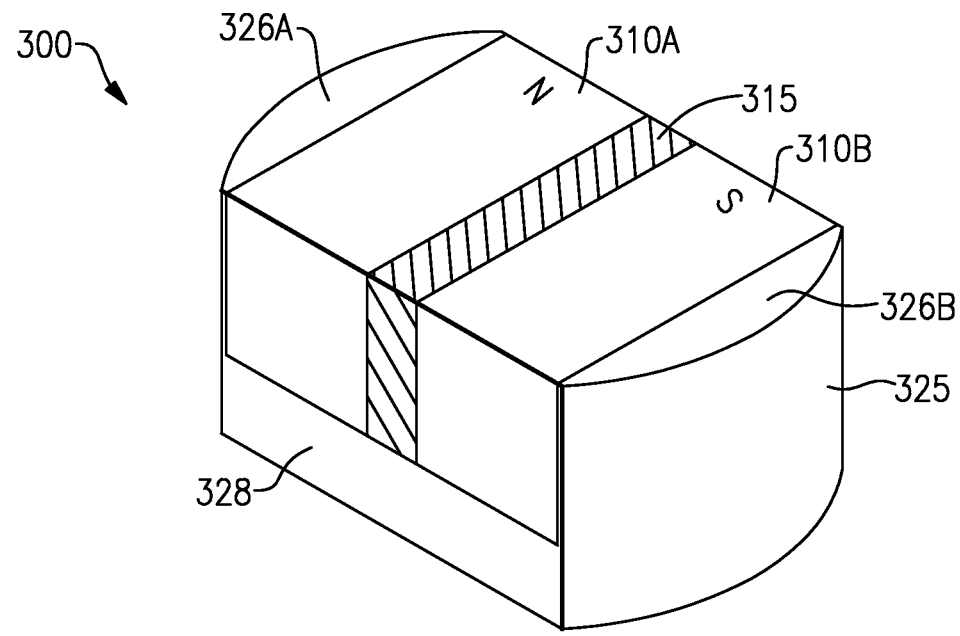
FIG. 3 is a diagram of an example magnetic structure, in accordance with embodiments described herein.

FIG. 3 is a diagram of an example magnetic structure 300, in accordance with embodiments described herein. The magnetic structure 300 comprises a housing 325, a first magnet 310A, a second magnet 310B, and an insert 315. In some embodiments, the housing may be coupled to a rotatable shaft (e.g., rotatable shaft 105) and may rotate when the rotatable shaft is driven by a motor (e.g., motor 110).

The housing 325 may comprise a magnetic redirecting material. As discussed above, the magnetic redirecting material may comprise a metal such as steel or copper. Additionally, the housing 325 may comprise one or more sections comprising one or more magnetic redirecting materials. For example, as shown in FIG. 3, the housing 325 comprises a first wall 326A, a second wall 326B, and a base 328. In some embodiments, the first wall 326A, the second wall 326B, and the base 328 comprise one continuous section of the same magnetic redirecting material. In other embodiments, the first wall 326A, the second wall 326B, and the base 328 comprise three separate sections coupled together and comprising three different magnetic redirecting materials. Accordingly, in certain configurations, the housing 325 can comprise two or more sections or pieces.

In the illustrated configuration, when viewed from above, the housing 325 includes a first pair of opposing walls, the first wall 326A and the second wall 326B, that are curved along an outer surface of the housing 325. In some embodiments, the first wall 326A and the second wall 326B are configured parallel to the axis of the north-south poles of the first magnet 310A and second magnet 310B. In some aspects, the housing 325 may not comprise walls positioned on the sides of the first magnet 310A and the second magnet 310B perpendicular to the axis of the north-south poles and the first and second walls 326A, 326B (as shown in FIG. 3). In such configurations, the housing comprises a first open face perpendicular to the first and second walls 326A, 326B, and a second open face opposite the first open face and perpendicular to the first and second walls 326A, 326B. The first open face and second open face may inhibit magnetic field lines from bowing outwards toward an area perpendicular to the first and second walls 326A, 326B at the ends of the magnets 310A and 310B. Such bowing may reduce the parallelism of the field lines in the region of interest. In other embodiments, the first wall 326A and the second wall 326B (or other walls) may completely surround the first magnet 310A and second magnet 310B such that all sides of the first magnet 310A and second magnet 310B, except the top-facing side, abut or touch a wall of the housing 325 or an insert positioned within the housing 325 and between the walls. In such an embodiment, the housing 326 may comprise a third and fourth wall (not shown), each perpendicular to the first and second walls 326A, 326B and spanning the distance between the first and second walls 326A, 326B.

The insert 315 may also comprise a magnetic redirecting material. In some embodiments, the magnetic redirecting material of the insert 315 is the same as the magnetic redirecting material of the housing 325. In other embodiments, the magnetic redirecting material of the insert 315 may comprise a material different from the magnetic redirecting material of the housing 325.

As discussed above, the insert 315 may aid in creating a uniform magnetic field in a predetermined area by pulling in stray magnetic field lines between the magnets 310A and 310B. Similarly, the housing 325 may also aid in creating a uniform magnetic field because the magnetic redirecting material of the housing 325 may also attract or pull in stray magnetic flux or field lines between the first and second magnets 310A and 310B. As shown, the first and second magnets 310A and 310B are positioned within the housing 325. In some embodiments, the first magnet 310A and the second magnet 310B are arranged in parallel and have poles of opposing polarity. As shown in FIG. 3, the insert 315 is positioned between the first magnet 310A and the second magnet 310B.

The insert 315 can be inserted or removed from the housing 325. In certain configurations, one of a plurality of inserts can be selected and inserted into the housing 325 such that the magnetic structure 300 generates a magnetic field suitable for a particular application that the magnetic structure 300 is being used in. The plurality of inserts can comprise inserts of different geometries and/or materials, such that the characteristics of the generated magnetic field can be fine-tuned. In some embodiments, the magnetic structure 300 and the plurality of inserts are arranged in a kit.

In some embodiments, the first magnet 310A may be positioned such that at least two sides of the first magnet 310A are at least partially surrounded by the housing 325. For example, one side of the magnet 310A may be positioned touching the first wall 326A and a second side of the magnet 310A may be positioned touching the base 328. Additionally, the second magnet 310B may also be positioned within the housing 325 such that at least two sides of the second magnet 310B are at least partially surrounded by the housing 325. For example, one side of the magnet 310B may be positioned touching the second wall 326B and a second side of the magnet 310B may be positioned touching the base 328. As shown in FIG. 3, the housing 325 may generally be in the shape of a "U" when viewed from a front angle with the base 328 representing the bottom portion of the "U" and the first wall 326A and the second wall 328B representing the sides. However, as described below, other shapes for the housing 325 are also possible. In some embodiments, the sides of the housing 325 may be curved. In some embodiments, the curved sides of the housing 325 may aid in positioning the magnetic structure 300 in a circular or elliptical recess or enclosure. For example, the curved housing 325 may be configured to fit on the axis of the AMR sensor system 101 of FIG. 1. In other embodiments the sides of the housing 325 may be configured in another geometric shape such as a square or hexagonal configuration. In these embodiments, the housing 325 may be configured to fit within a corresponding square or hexagonal recess or enclosure. In some embodiments, the first magnet 310A, the second magnet 310B, and the insert 315 may be positioned within the housing 325 such that no space occurs between the housing 325, the first magnet 310A, the insert 315, and the second magnet 310B.

Figure 4:
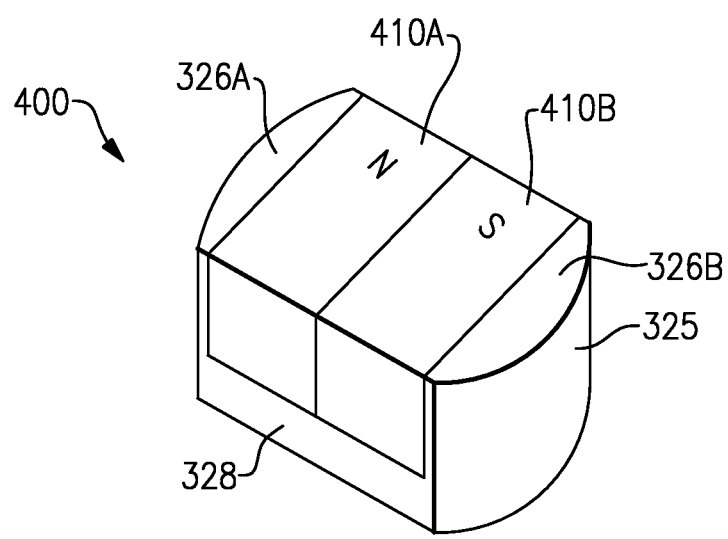
FIG. 4 is a diagram of another example magnetic structure, in accordance with embodiments described herein.

FIG. 4 is a diagram of another magnetic structure 400, in accordance with embodiments described herein. The magnetic structure 400 comprises a first magnet 410A, a second magnet 410B, and the housing 325. In this embodiment, there is no insert between the first magnet 410A and the second magnet 410B, and the first and the second magnets 410A and 410B are of the same geometric shape and size. Additionally, the first magnet 410A and the second magnet 410B are positioned within the housing 325 such that one side of the first magnet 410A is touching the first wall 326A, one side of the first magnet 410A is touching the base 328, and one side of the first magnet 410A is touching the second magnet 410B. In some embodiments, as in FIG. 3, the one side touching the second magnet 410B may be touching an insert instead of the second magnet 410B. The second magnet 410B may be positioned within the housing 325 such that one side of the second magnet 410B is touching the second wall 326B, one side of the second magnet 410B is touching the base 328, and at least one side of the first magnet 410B is touching the second magnet 410A. In some embodiments, an insert may be positioned between the first wall 326A and the first magnet 410A and/or positioned between the second wall 326B and the second magnet 410B (for example, see FIG. 7)

Figure 5:
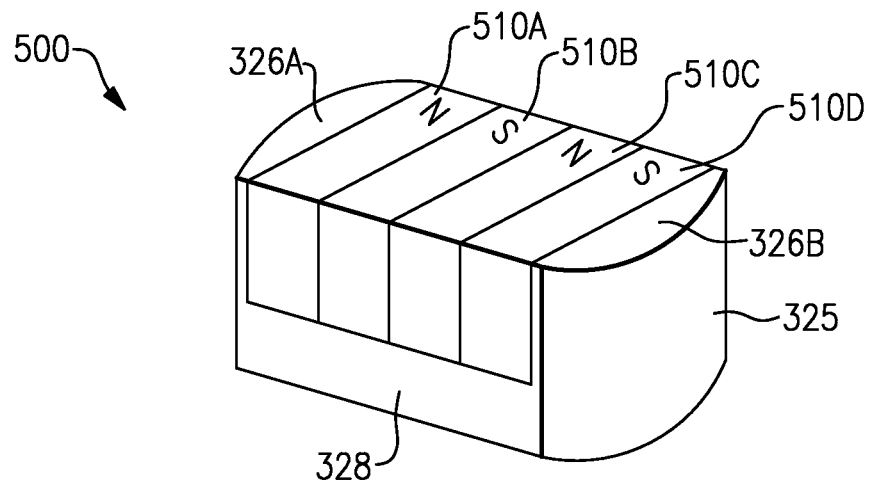
FIG. 5 is a diagram of an example magnetic structure utilizing four magnets.

In some embodiments, more than two magnets may be used in a magnetic structure. FIG. 5 is a diagram of an example magnetic structure 500 utilizing four magnets. In FIG. 5, four magnets, a first magnet 510A, a second magnet 510B, a third magnet 510C, and a fourth magnet 510D, are located within the housing 325. As shown in FIG. 5, the magnets 510 are of equal size, alternating polarity, and are arranged parallel or side-by-side with one another.

Figure 6:
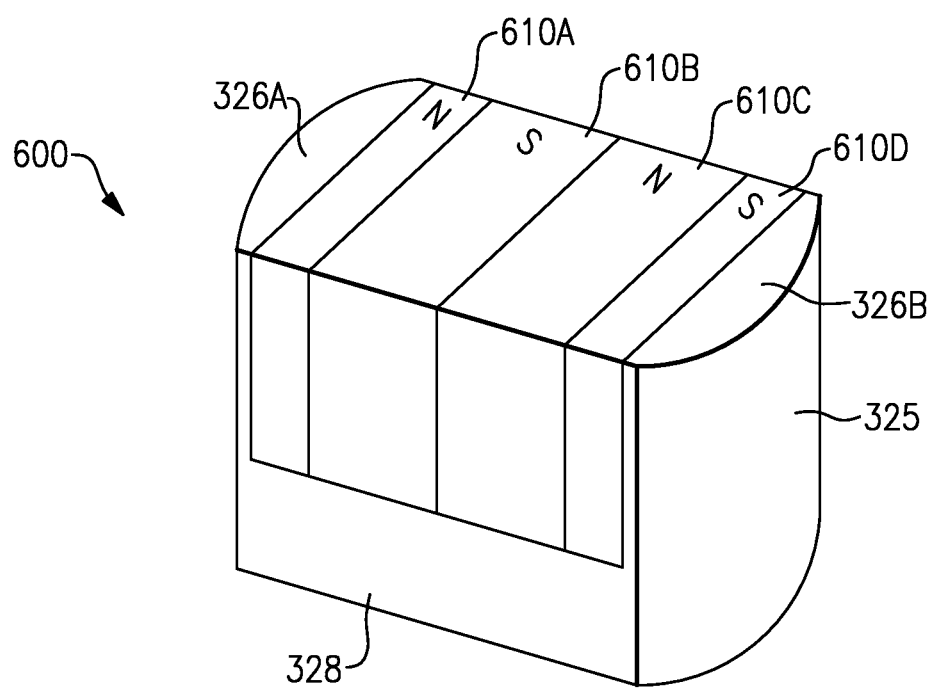
FIG. 6 is a diagram of a magnetic structure illustrating four magnets of unequal size, in accordance with embodiments described herein.

FIG. 6 is a diagram of a magnetic structure 600 illustrating four magnets of unequal size within the housing 325. In this embodiment, the first and fourth magnets 610A and 610D are smaller and thinner in size than the second and third magnets 610B and 610C. Thus, the four magnets comprise a first pair of magnets 610A, 610D of opposite polarity and of a first size, and a second pair of magnets 610B, 610C of opposite polarity and a second size. In this configuration, the magnets 610A-610D alternate in polarity and are parallel with one another within the housing 325.

Figure 7:
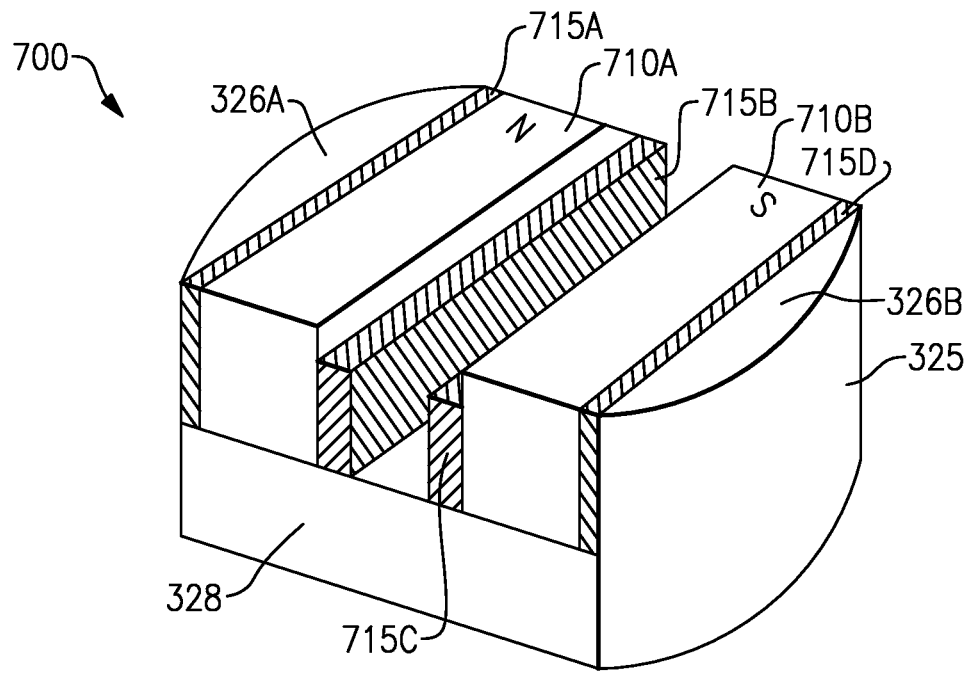
FIG. 7 is a diagram of an example magnetic structure illustrating the use of multiple inserts, in accordance with embodiments described herein.

In some embodiments, multiple magnetic redirecting inserts may be used in a magnetic structure configuration. FIG. 7 is a diagram of an example magnetic structure 700 illustrating the use of multiple inserts. As shown in FIG. 7, the magnetic structure 700 comprises a first insert 715A, a second insert 715B, a third insert 715C, and a fourth insert 715D. The magnetic structure 700 also comprises a first magnet 710A and a second magnet 710B positioned within the housing 325, parallel to one another and with opposing polarity. In this embodiment, the first magnet 710A is positioned between the first insert 715A and the second insert 715B. Additionally, the first insert 715A is positioned between the housing 325 on one side and the first magnet 710A on the other side.

As shown in FIG. 7, the first insert 715A and the second insert 715B have different heights, however, inserts of equal height are also possible. The second magnet 710B is positioned within the housing 325 between the third insert 715C and the fourth insert 715D. The fourth insert 715D is positioned between the housing 325 and the second magnet 710B. As shown in FIG. 7, the magnetic structure 700 comprises a space between the second insert 715B and the third insert 715C, however, in some embodiments, there may be no space between the second insert 715B and the third insert 715C. In some embodiments, the inserts 715A-715D may comprise the same magnetic redirecting material or may comprise different magnetic redirecting material.

Figure 8:
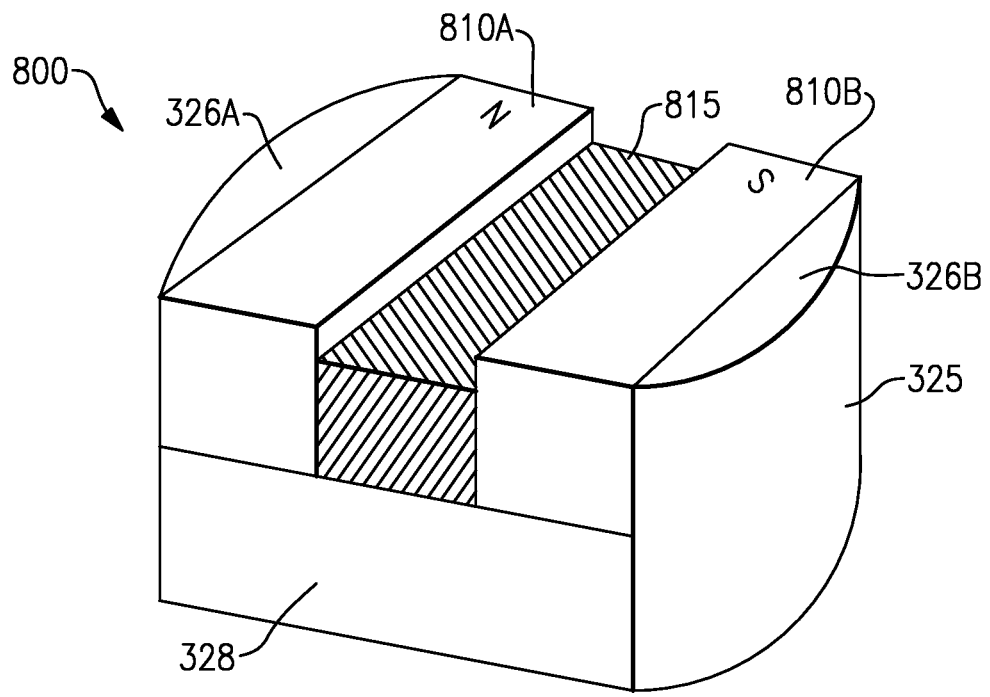
FIG. 8 is a diagram of an example magnetic structure illustrating an insert positioned between two magnets, in accordance with embodiments described herein.

FIG. 8 is a diagram of a magnetic structure 800 illustrating an insert positioned between two magnets. The magnetic structure 800 comprises a first magnet 810A, a second magnet 810B, an insert 815, and the housing 325. As shown in FIG. 8, the insert 815 is positioned such that a first side touches the first magnet 810A, a second side touches the second magnet 810B, and a third side touches the housing 325. In some embodiments, the insert 815 may comprises a different height than the first and second magnets 810A and 810B. For example, as shown in FIG. 8, the insert 815 has a shorter height than the first and second magnets 810A and 810B.

Figure 9:
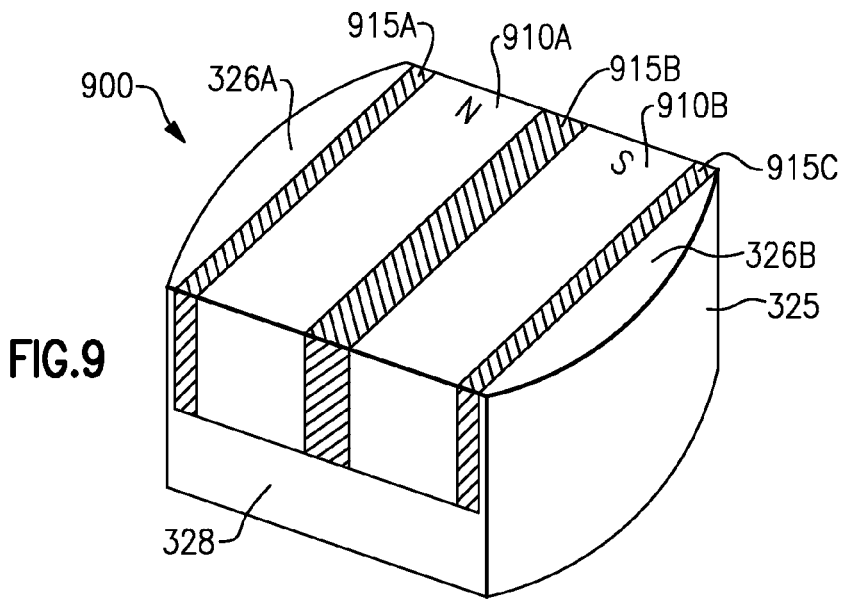
FIG. 9 is a diagram of an example magnetic structure illustrating the use of multiple inserts, in accordance with embodiments described herein.

FIG. 9 is a perspective view of a magnetic structure 900 comprising a first magnet 910A, a second magnet 910B, a first insert 915A, a second insert 915B, and a third insert 915c located within the housing 325. In this embodiment, the first and third inserts 915A and 915C are of equal geometric size and shape and the second insert 915B is of a different geometric size and shape.

Figure 10A:
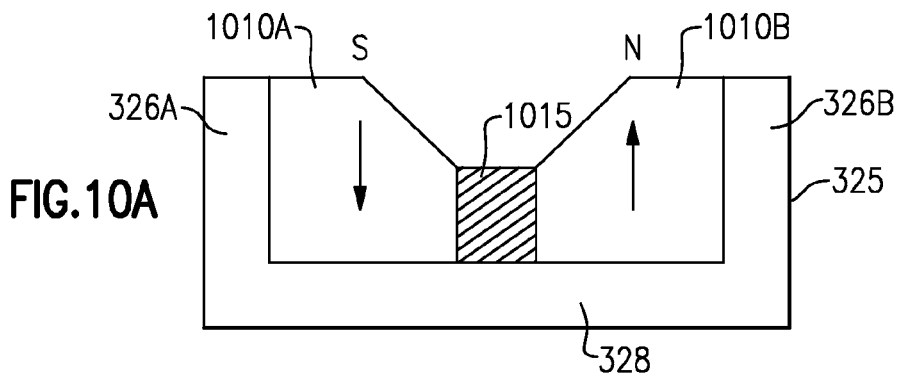
FIG. 10A is a side view of an example magnetic structure comprising magnets with beveled edges, in accordance with embodiments described herein.
Figure 10B:
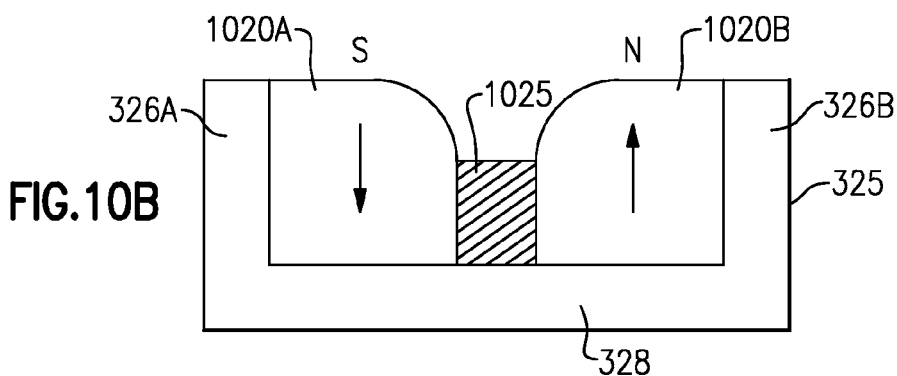
FIG. 10B is a side view of an example magnetic structure comprising magnets with rounded edges, in accordance with embodiments described herein.
Figure 10C:
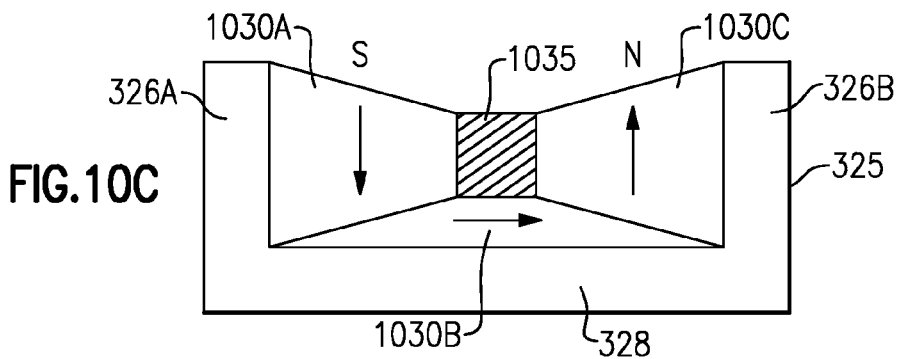
FIG. 10C is a side view diagram of an example magnetic structure comprising three trapezoidal magnets, in accordance with embodiments described herein.

FIGS. 3-9 illustrate magnetic structures comprising magnets of a rectangular prismatic shape, however the magnets described herein may comprise other prismatic geometric shapes. For example, FIGS. 10A-10C illustrate embodiments with magnets of a geometric shape other than rectangular prismatic shapes. Examples of prismatic geometric shapes suitable for use in magnetic structures include, but are not limited to, rectangular prisms, hexagonal prisms, octagonal prisms, or any other prismatic shape. In some embodiments, the most desirable prismatic shape may be determined based on the application for use, the position and area of interest, the strength of the magnetic field, and the field shape inside the area of interest.

FIG. 10A is a side view of a magnetic structure comprising a first magnet 1010A, a second magnet 1010B, insert 1015, and housing 325. In this embodiment, the first and second magnets 1010A and 1010B each comprise a cross-section of a rectangular shape with a beveled edge. In some embodiments, one or more corners of the first and second magnets 1010A and 1010B may comprise beveled edges. As shown, the beveled edges of the first and second magnets 1010A and 1010B are configured such that they connect with the top of the insert 1015. In some embodiments, the top of the insert 1015 may sit above or below the beveled edges.

FIG. 10B is a side view of a magnetic structure comprising first and second magnets 1020A and 1020B having a rectangular shape with a rounded edge and insert 1025 within the housing 325. In some embodiments, one or more corners of the first and second magnets 1020A and 1020B may comprise rounded corners.

FIG. 10C is a side view diagram of a magnetic structure comprising three trapezoidal magnets including a first magnet 1030A, a second magnetic 1030B, and a third magnet 1030C positioned within the housing 325. The magnetic structure further comprises an insert 1035 positioned between the first to third magnets 1030A, 1030B, and 1030C such that a first side of the insert 1035 touches the first magnet 1030A, a second side of the insert 1035 touches the second magnet 1030B, and a third side of the insert 1035 touches the third magnet 1030C.

In some embodiments, the sides of the housing described herein may comprise different geometric shapes. For example, while FIGS. 3-9 illustrate a housing with curved sides, other geometric shapes are possible for a housing. The housing shapes may be customized to fit within certain electrical and mechanical components or openings.

Figure 11:
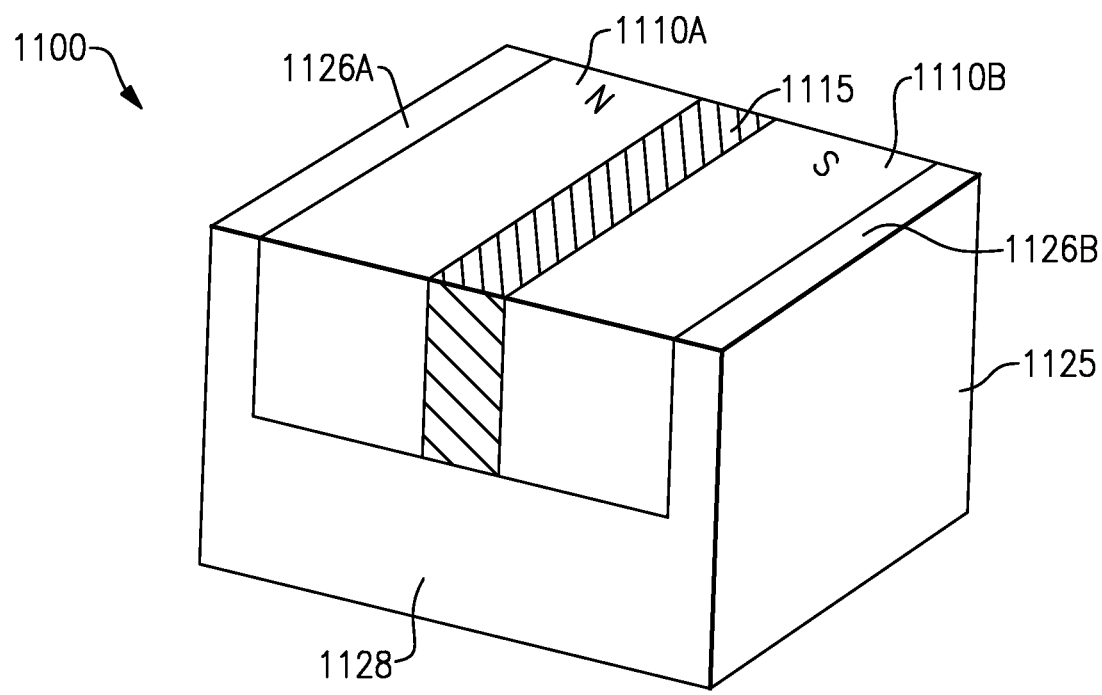
FIG. 11 is a perspective view of a magnetic structure comprising a housing having a rectangular shape, in accordance with embodiments described herein.

FIG. 11 is a perspective view of a magnetic structure 1100 comprising a housing 1125 having a rectangular shape. The magnetic structure 1100 comprises a first magnet 1110A, a second magnet 1110B, and an insert 1115 positioned within the housing 1125. The housing 1125 comprises a first wall 1126A, a second wall 1126B, and a base 1128.

Figure 12:
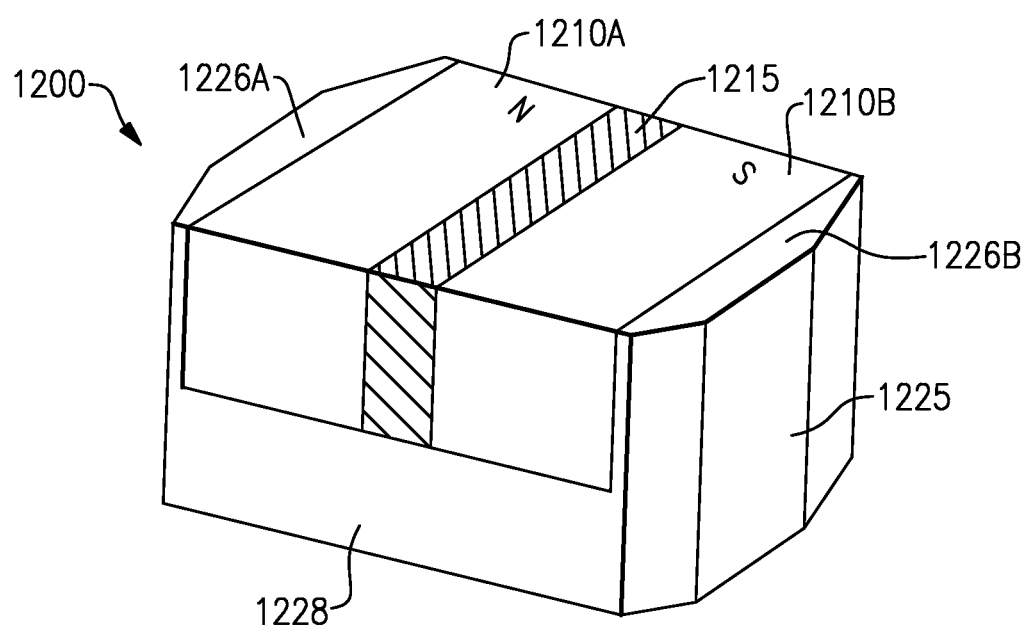
FIG. 12 is a perspective view of a magnetic structure comprising a housing having a hexagonal shape, in accordance with embodiments described herein.

FIG. 12 is a perspective view of a magnetic structure 1200 comprising a housing 1225 having a hexagonal shape when viewed from above. The magnetic structure 1200 comprises a first magnet 1210A, a second magnet 1210B, and an insert 1215 located within the housing 1225. The housing 1225 comprises a first wall 1226A, a second wall 1226B, and a base 1228.

Figure 13:
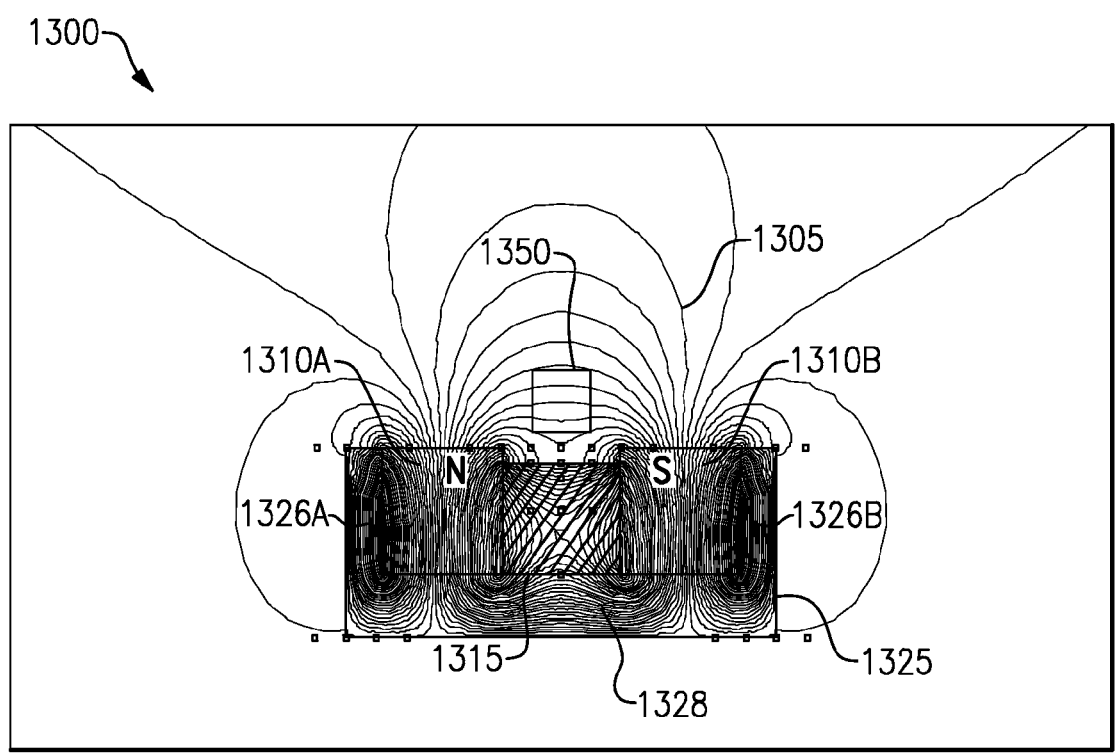
FIG. 13 is a side view of an example magnetic structure configuration illustrating magnetic field lines associated with the magnetic structure, in accordance with embodiments described herein.

As described above, a magnetic redirecting housing and/or insert may aid in creating a uniform magnetic field in a predetermined area or region. FIG. 13 is a side view of a magnetic structure configuration 1300 illustrating magnetic field lines associated with the magnetic structure 1300, in accordance with embodiments described herein. In FIG. 13, the magnetic structure 1300 comprises a first magnet 1310A, a second magnet 1310B, and an insert 1315 located within a housing 1325. Insert 1315 and housing 1325 comprise magnetic redirecting material. In some embodiments, insert 1315 and 1325 may comprise the same or different magnetic redirecting material. The housing 1325 comprises a first wall 1326A, a second wall 1326B, and a base 1328.

In some embodiments, a magnetic structure generates a substantially uniform field in a region of interest having a length in the range of about 3 mm to about 6 mm, a width in the range of about 2 mm to about 5 mm, and a height in the range of about 1 mm to about 5 mm. However, regions of interest of other sizes are possible. In certain configurations, the region of interest may be spaced from a top surface of the magnetic structure such that there is an air gap between the region of interest and the magnetic structure. For example, in some embodiments, the region of interest is spaced from a top surface of the magnetic structure by a distance in the range of about 1 mm to about 5 mm. However, other configurations are possible.

The magnetic field lines associated with a magnetic field generated by the magnetic structures herein can be uniformly spaced and substantially parallel to one another in the region of interest. In some embodiments, the magnetic field lines in the region of interest have a uniformity in the range of about +/−0.1 degrees or less. However, other configurations are possible.

FIG. 13 illustrates magnetic field lines 1305 that may be generated as a result of the magnetic structure configuration 1300. FIG. 13 also illustrates a predetermined region 1350 which may comprise an area of interest where it is desirable that the magnetic field lines 1305 are parallel and uniform. In some embodiments, the predetermined region 1350 may comprise an area where a sensor (e.g., sensor 130) may be positioned in accordance with the AMR sensor system 100 of FIG. 1. As shown, the magnetic field lines 1305 are substantially parallel and uniformly spaced within the predetermined region 1350. As described above, the parallel lines indicate a uniform magnetic field and may allow for more accurate sensing and results from a sensor positioned within the predetermined region 1350.

Figure 14:
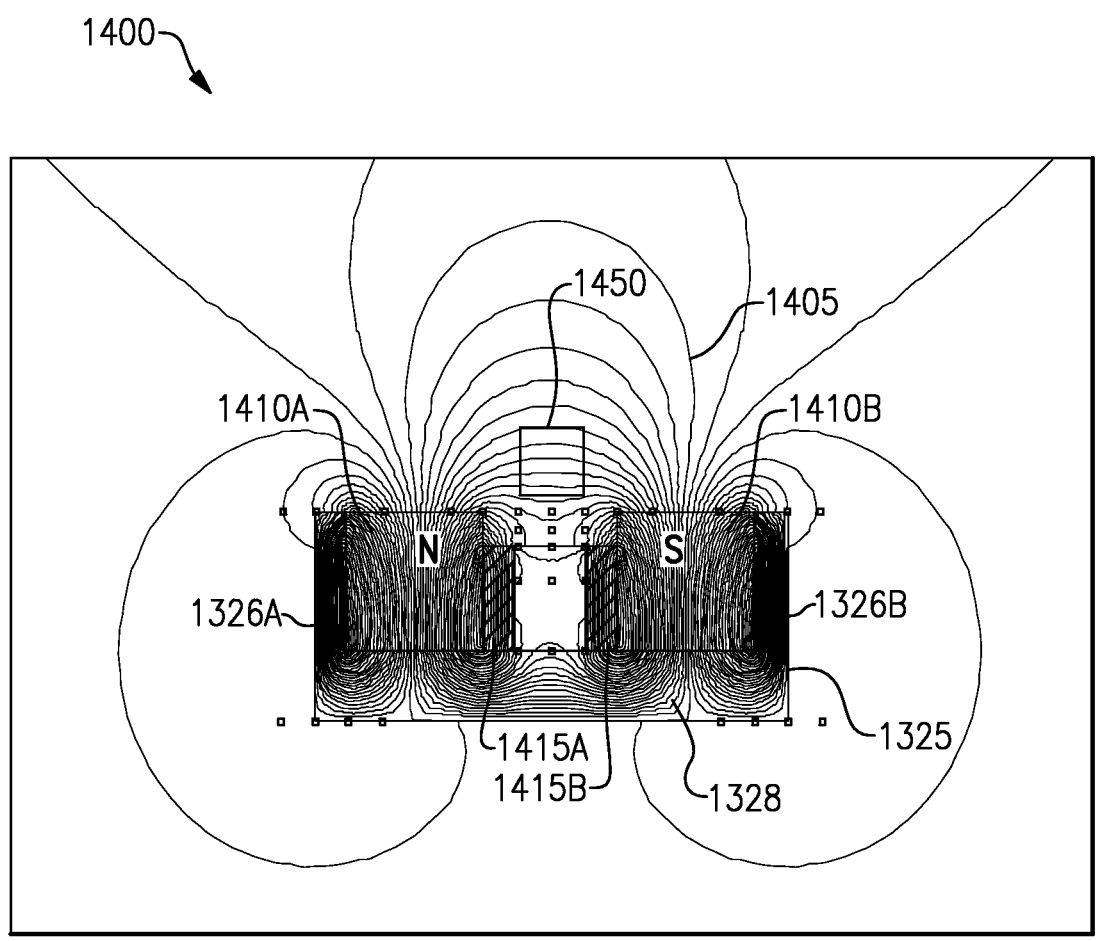
FIG. 14 is a side view of another example magnetic structure configuration illustrating magnetic field lines associated with the magnetic structure, in accordance with embodiments described herein.

FIG. 14 is a side view of an example magnetic structure configuration 1400 illustrating magnetic field lines associated with the magnetic structure 1400 in accordance with embodiments described herein. The magnetic structure 1400 comprises a first magnet 1410A, a second magnet 1410B, a first insert 1415A, and a second insert 1415B located within the housing 1325. FIG. 14 also illustrates magnetic field lines 1405 and a predetermined area 1450. Similar to the predetermined area 1350 in FIG. 13, the predetermined area 1450 in FIG. 14 may include a sensor for detecting a speed or angle of a shaft 105 as described above with respect to FIG. 1. As shown in FIG. 14, the magnetic field lines 1405 within the predetermined region 1450 are substantially parallel and uniformly spaced and may facilitate more accurate and efficient readings from a sensor positioned within the predetermined region 1450.

Figure 15:
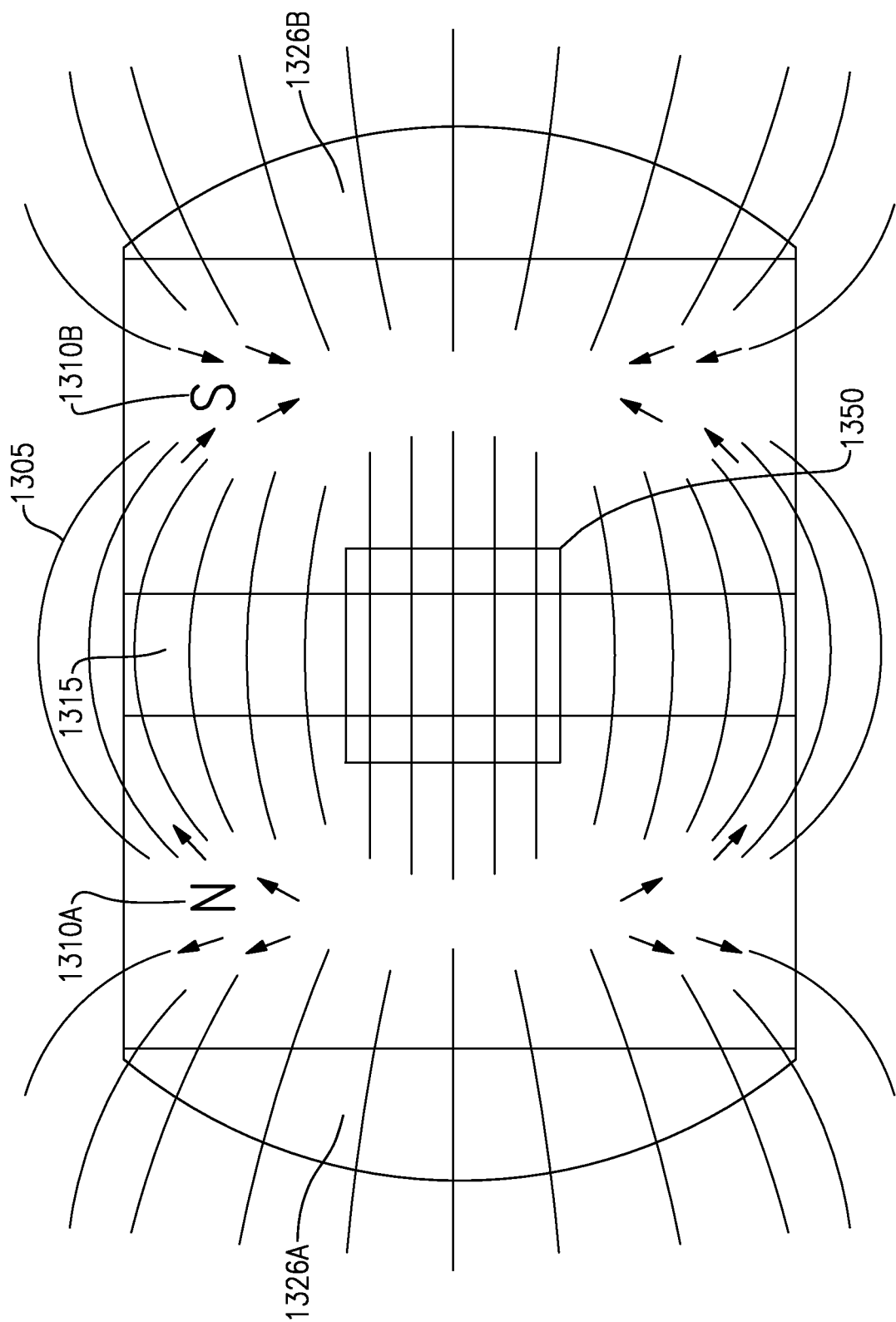
FIG. 15 is a top view of another example magnetic structure configuration illustrating magnetic field lines associated with the magnetic structure, in accordance with embodiments described herein.

FIG. 15 is a top view of an example magnetic structure configuration 1300 illustrating magnetic field lines associated with the magnetic structure 1300 in accordance with embodiments described herein. As shown, the magnetic field lines 1305 are substantially parallel and uniformly spaced within the predetermined region 1350.

The arrangements described herein can provide simple and robust angular position measurement, and find utility in industrial, automotive, and aeronautical industries as well as within consumer products. It is thus possible to provide improved AMR sensing using the magnetic structure configurations described herein.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. An apparatus, comprising:
    a rotatable housing comprising:
        a first wall comprising a first magnetic redirecting material; and
        a second wall with a second planar surface that is opposite of a first planar surface of the first wall, the second wall comprising the first magnetic redirecting material;
        a first open face between the first and second walls; and
        a second open face opposite the first open face and between the first and second walls;
    at least two magnets positioned within the rotatable housing between the first and second walls, wherein the at least two magnets comprise a first pair of magnets magnetized parallel and opposite to one another, wherein the rotatable housing alters a magnetic field of the at least two magnets relative to a configuration including the at least two magnets without the rotatable housing, and wherein the rotatable housing inhibits the magnetic field from bowing in a region of interest relative to a configuration without the first and second open faces.

2. The apparatus of claim 1, wherein the first and second walls are positioned parallel to an axis of north-south poles of each magnet of the first pair of magnets, wherein the first wall only contacts one magnet of the at least two magnets and the second wall only contacts a different magnet of the at least two magnets.

3. The apparatus of claim 1, further comprising an insert positioned between the first and second walls.

4. The apparatus of claim 3, wherein the insert comprises a non-magnetic material.

5. The apparatus of claim 3, wherein the insert comprises a second magnetic redirecting material.

6. The apparatus of claim 3, wherein the insert is positioned between a first magnet and a second magnet of the first pair of magnets, wherein the first and second magnets are positioned between the first and second walls.

7. The apparatus of claim 1, wherein the first magnetic redirecting material comprises steel, iron, or copper.

8. The apparatus of claim 1, wherein the at least two magnets each comprise a rectangular prismatic shape.

9. The apparatus of claim 1, wherein the first wall and the second wall are curved along an outer surface of the rotatable housing.

10. The apparatus of claim 1, wherein the rotatable housing further comprises a second magnetic redirecting material that is different from the first magnetic redirecting material.

11. The apparatus of claim 1, wherein the at least two magnets comprise an array of magnets positioned within the rotatable housing between the first and second walls, wherein the array of magnets comprise magnetic axes that are parallel to one another, and wherein the magnets of the array alternate in polarity.

12. The apparatus of claim 1, further comprising two or more inserts positioned between the first and second walls, wherein the two or more inserts comprise a second magnetic redirecting material that is different than the first magnetic redirecting material.

13. The apparatus of claim 1, wherein the rotatable housing further comprises a base, wherein the base comprises the first magnetic redirecting material.

14. The apparatus of claim 1, wherein the first and second open faces of the rotatable housing inhibit the magnetic field from bowing outward toward an area perpendicular to the first and second walls and reducing a parallelism of field lines in the region of interest.

15. The apparatus of claim 1, wherein the first open face is perpendicular to the first and second walls, and the second open face is perpendicular to the first and second walls.

16. A method for generating a uniform magnetic field, said method comprising:
    providing a rotatable housing comprising a first wall, a second wall opposite the first wall, a first open face between the first and the second walls, and a second open face opposite the first open face and between the first and second walls, the first wall and second wall each comprising a first magnetic redirecting material;
    positioning at least two magnets within the rotatable housing between the first and second walls, wherein the at least two magnets comprise a first pair of magnets that are magnetized parallel and opposite to one another; and
    generating a uniform magnetic field in a region of interest using the at least two magnets and the housing, including using the housing to alter a magnetic field of the at least two magnets relative to a configuration including the at least two magnets without the housing, and to inhibit the magnetic field from bowing in the region of interest.

17. The method of claim 16, wherein positioning the at least two magnets within the rotatable housing comprises positioning an axis of north-south poles of each magnet of the first pair of magnets parallel to the first and second walls.

18. The method of claim 16, further comprising positioning an insert between the first and second walls, the insert comprising a second magnetic redirecting material.

19. The method of claim 16, further comprising positioning a sensor proximate the rotatable housing in the uniform magnetic field.

20. The method of claim 16, further comprising using the rotatable housing to inhibit the magnetic field from bowing outward toward an area perpendicular to the first and second walls and reducing a parallelism of field lines in the region of interest.

21. An angular position sensing apparatus, comprising:
    a rotatable housing comprising:

a first wall comprising a first magnetic redirecting material;

a second wall opposite the first wall, the second wall comprising the first magnetic redirecting material;

a first open face between the first and second walls; and a second open face opposite the first open face and between the first and second walls;

at least two magnets positioned within the housing between the first and second walls, wherein the at least two magnets comprises a first pair of magnets magnetized parallel and opposite to one another, wherein the at least two magnets and the rotatable housing generate a uniform, non-bowing magnetic field in a region of interest; and a sensor positioned in the uniform magnetic field.

22. The apparatus of claim 21, wherein the sensor is positioned in an area radially centered between the at least two magnets.

23. The apparatus of claim 21, wherein the sensor comprises an anisotropic magnetoresistive (AMR) sensor.

24. The angular position sensing apparatus of claim 21, wherein the first and second open faces of the rotatable housing inhibit the magnetic field from bowing outward toward an area perpendicular to the first and second walls and reducing a parallelism of field lines in the region of interest.

* * * * *